United States Patent [19]
Hasegawa et al.

[11] Patent Number: 5,291,023
[45] Date of Patent: Mar. 1, 1994

[54] POSITION DETECTING SYSTEM UTILIZING A WEIGHT COEFFICIENT TO DETERMINE A GRAVITY CENTER OF LIGHT

[75] Inventors: Masanobu Hasegawa, Fujisawa; Minoru Yoshii, Tokyo; Naoto Abe, Isehara, all of Japan

[73] Assignee: Canon Kabushiki Kaisha, Tokyo, Japan

[21] Appl. No.: 21,480

[22] Filed: Feb. 22, 1993

[30] Foreign Application Priority Data

Feb. 21, 1992 [JP] Japan .................. 4-072235

[51] Int. Cl.⁵ .................................. G01N 21/86
[52] U.S. Cl. .................. 250/548; 250/208.2; 356/400
[58] Field of Search .......... 250/548, 561, 203.2; 356/401, 172, 400, 1, 4, 5

[56] References Cited

U.S. PATENT DOCUMENTS

| | | | |
|---|---|---|---|
| 4,037,969 | 7/1977 | Feldman et al. | 356/172 |
| 4,326,805 | 4/1982 | Feldman et al. | 356/399 |
| 4,825,393 | 4/1989 | Nishiya | 250/561 |
| 5,028,797 | 7/1991 | Abe et al. | 250/548 |
| 5,114,235 | 5/1992 | Suda et al. | 356/401 |
| 5,114,236 | 5/1992 | Matsugu et al. | 250/548 |
| 5,196,711 | 3/1993 | Matsugu et al. | 250/548 |
| 5,200,800 | 4/1993 | Suda et al. | 250/548 |
| 5,229,617 | 7/1993 | Saitoh et al. | 250/548 |
| 5,235,408 | 8/1993 | Matsugu et al. | 250/548 |

FOREIGN PATENT DOCUMENTS 56-157033 12/1981 Japan .
2-167406  6/1990 Japan .

Primary Examiner—David C. Nelms
Assistant Examiner—T. Davenport
Attorney, Agent, or Firm—Fitzpatrick, Cella, Harper & Scinto

[57] ABSTRACT

A position detecting system for detecting the relative position of two objects is disclosed wherein: light is projected to the two objects so that the light from the two objects is received by a position detector; to an output signal from the detector is applied a weight coefficient corresponding to the position to determine a gravity center of the light incident; a region of the position detector is set on the basis of the determination; the gravity center of the light incident is determined again on the basis of the set region; and the relative position of the two objects is determined on the basis of the second determination.

6 Claims, 15 Drawing Sheets

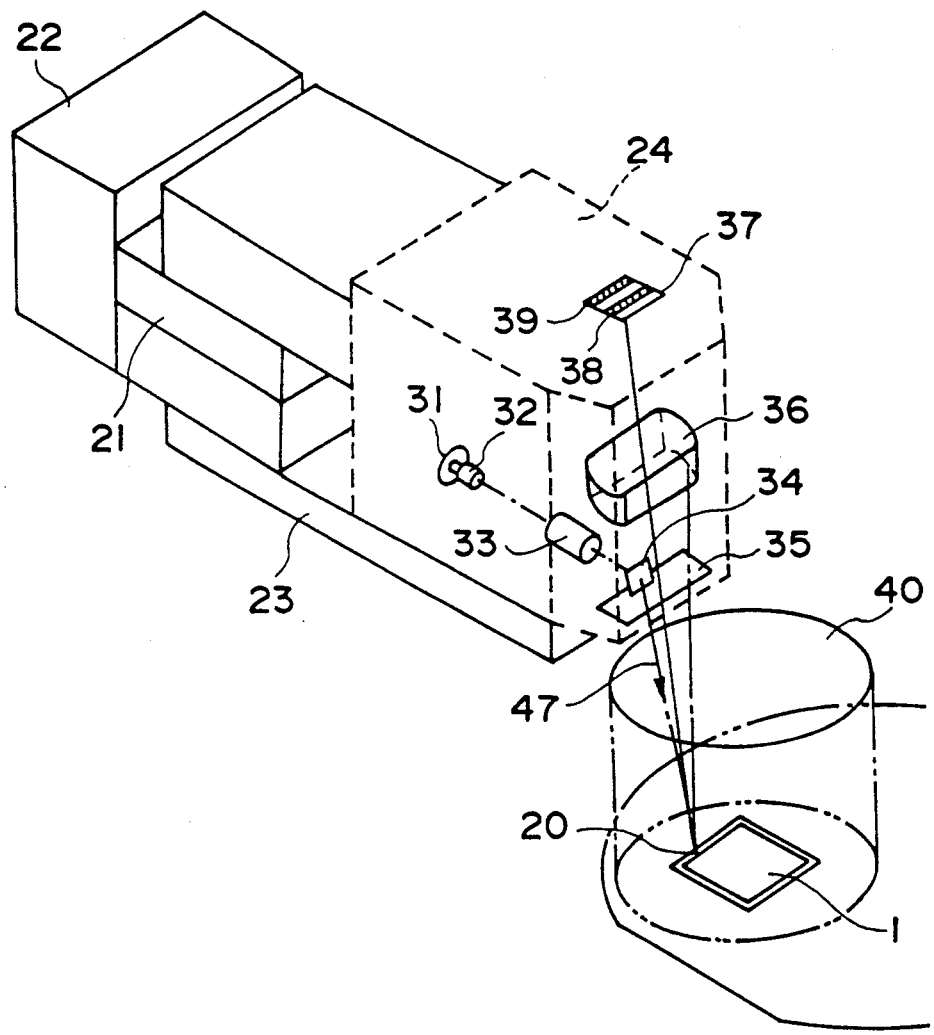
F I G. 1

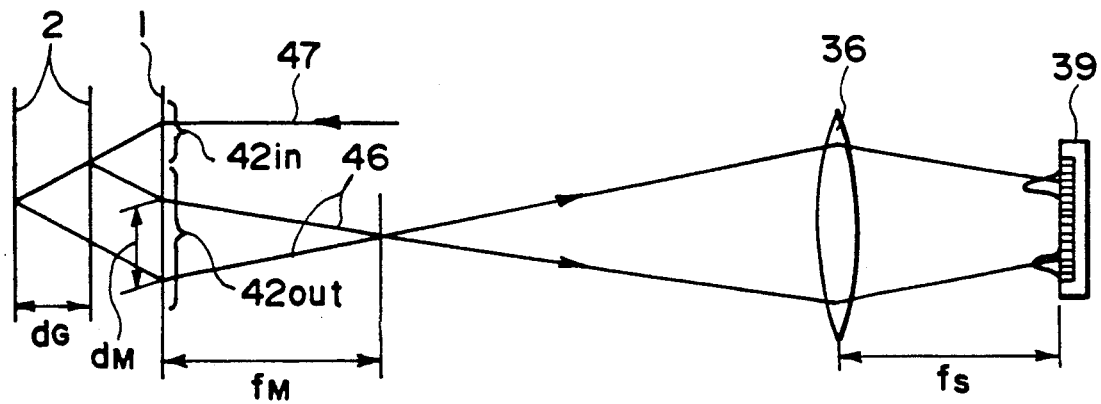
F I G. 3
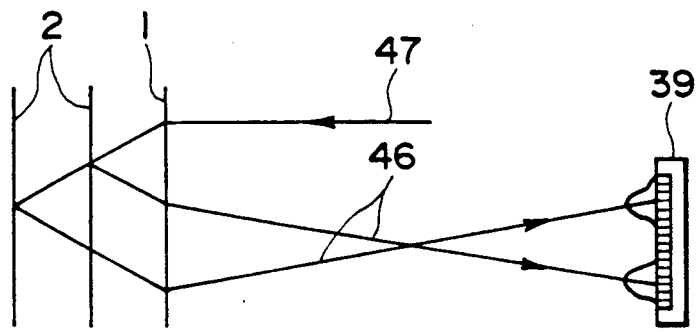
F I G. 4A
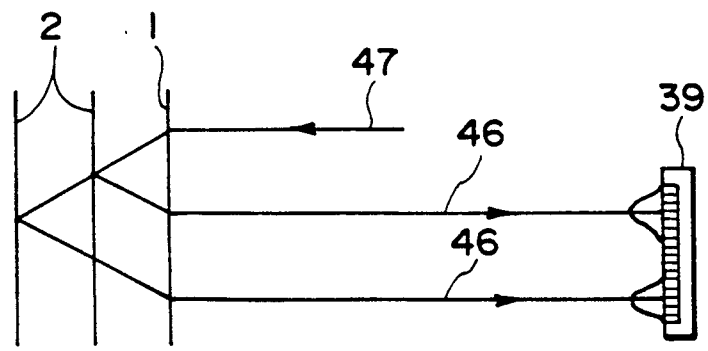
F I G. 4B

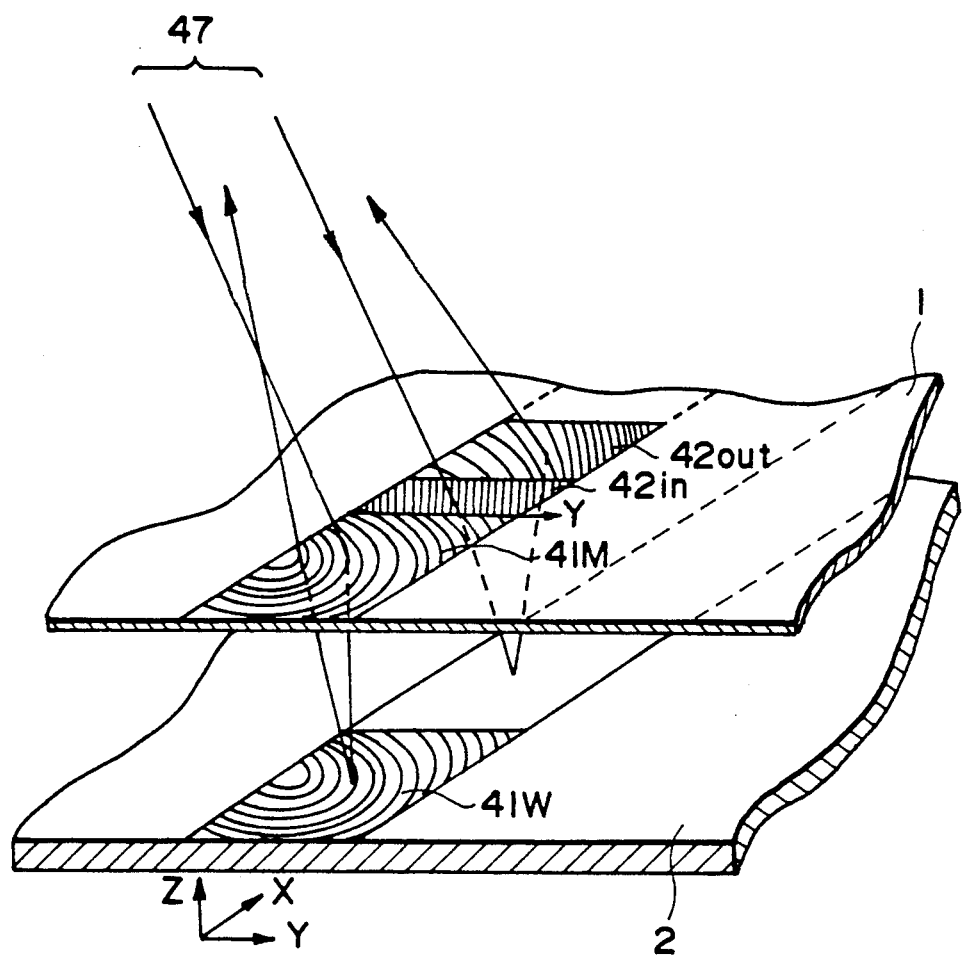
F I G. 5

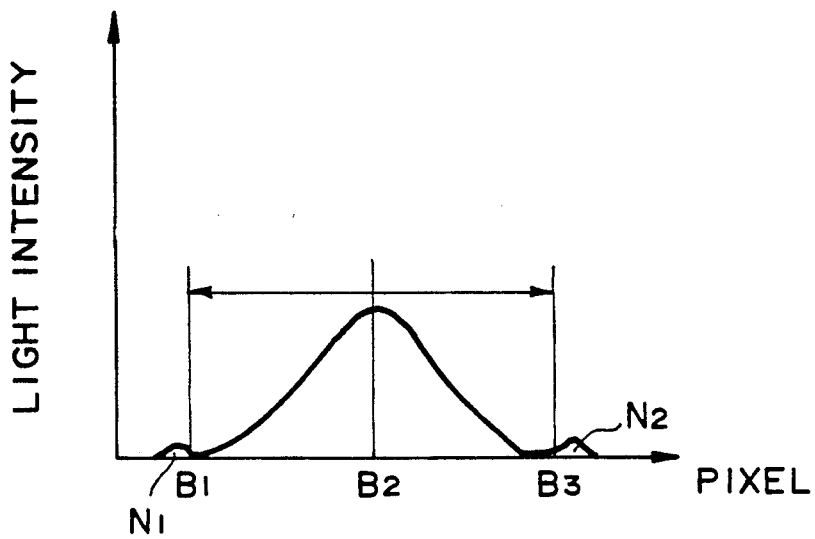
F I G. 10A
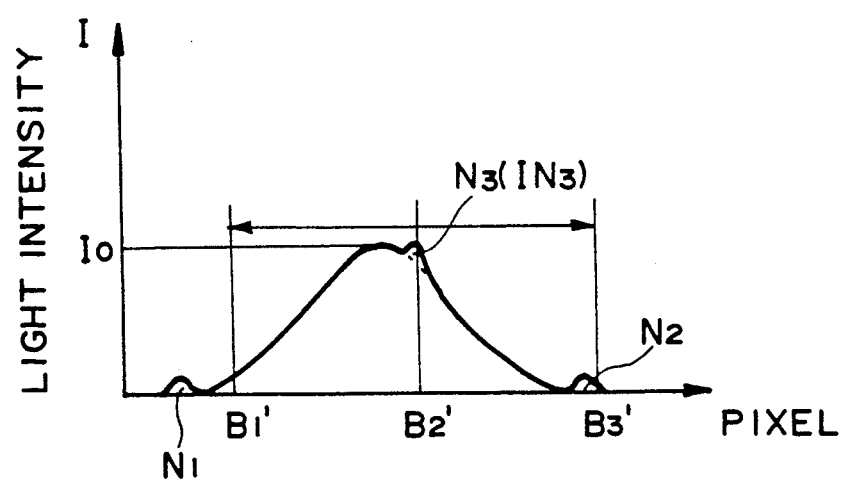
F I G. 10B

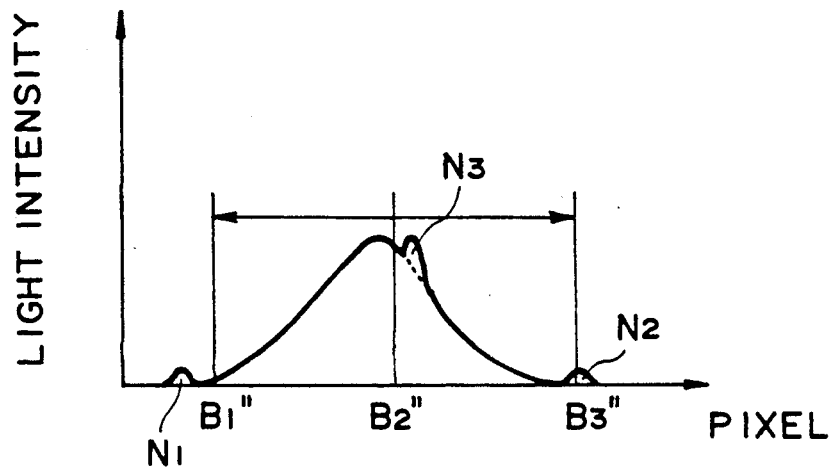
F I G. 12A
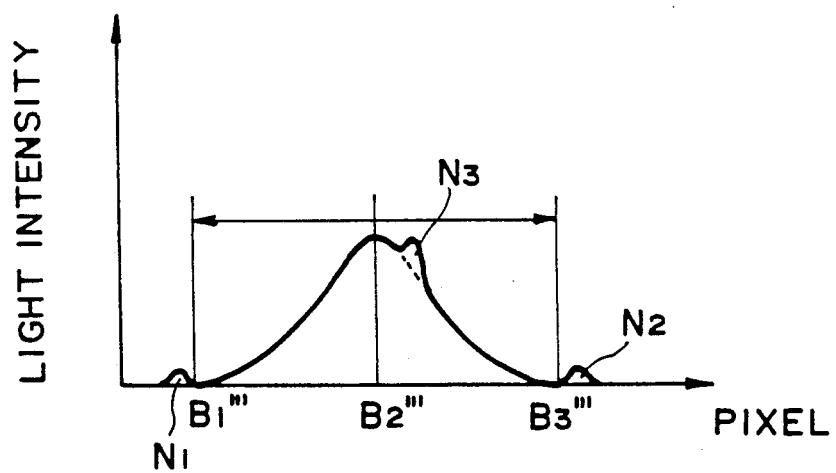
F I G. 12B

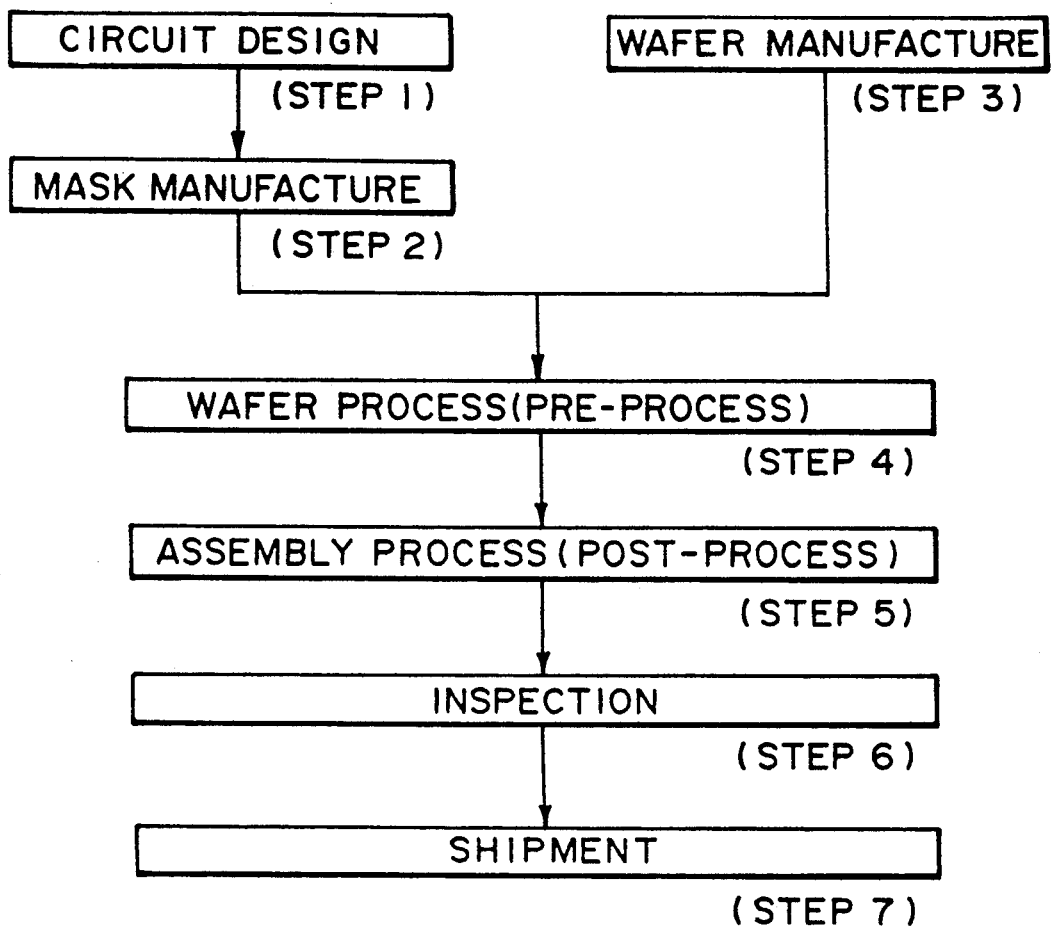
F I G. 16

1

POSITION DETECTING SYSTEM UTILIZING A WEIGHT COEFFICIENT TO DETERMINE A GRAVITY CENTER OF LIGHT

FIELD OF THE INVENTION AND RELATED ART

This invention relates to a position detecting system. More particularly, the invention is concerned with a position detecting system suitably usable, for example, in an exposure apparatus for manufacture of semiconductor devices, for relatively and, particularly, three-dimensionally positioning or aligning a first object such as a mask or reticle (hereinafter simply "mask") and a second object such as a wafer in an occasion when a fine electronic pattern formed on the first object is to be lithographically transferred to the second object.

In exposure apparatuses for manufacture of semiconductor devices, the relative alignment of a mask and a wafer is one important factor for ensuring improved performance. Particularly, as for alignment systems employed in recent exposure apparatuses, submicron alignment accuracies or more strict accuracies are required in consideration of the demand for higher degrees of integration of each semiconductor device.

In many types of alignment systems, features called "alignment patterns" are provided on a mask and a wafer and, by utilizing positional information obtainable from these patterns, the mask and the wafer are aligned. As for the manner of attaining the alignment, as an example there is a method wherein the amount of relative deviation of these alignment patterns is detected on the basis of image processing. Another method is disclosed in U.S. Pat. No. 4,037,969 or Japanese Laid-Open Patent Application, Laid-Open No. 157033/1981 wherein so-called zone plates are used as alignment patterns upon which light is projected and wherein the positions of light spots formed on a predetermined plane by lights from the illuminated zone plates are detected.

Generally, an alignment method using zone plates is relatively insensitive to any defect of an alignment pattern, and it assures relatively high alignment accuracies, as compared with an alignment method simply using traditional alignment patterns.

In the alignment system proposed in U.S. Pat. No. 4,037,969 or Japanese Laid-Open Patent Application, Laid-Open No. 157033/1981, for determination of the relative positional deviation of a mask and a wafer, lights from wavefront converting elements (physical optic elements) such as, for example, a diffraction grating, zone plates or holograms, using the property of light as waves, provided on the mask and the wafer, are imaged separately upon a predetermined plane, on which evaluation is to be made. Then, deviations of imaged lights from respective reference positions are detected.

However, in such an alignment system, the light quantity distribution or light intensity distribution of those lights incident on a detector (sensor) is signal-processed directly. This causes the following inconveniences:

(a) Various components (other than the signal light to be duly processed) coming to the sensor, such as background light (e.g. scattered light caused by scattering by the object to be aligned) or unwanted light or noise light (e.g. stray light caused in the optical system), are all photoelectrically converted. This applies a large burden on the sensor signal processing circuit, for removing the effect of unwanted light.

(b) It is not easy to enlarge the sensor to a great extent so as to cover the measurement range. For example, in a case when the position of light impinging on a sensor is to be detected to measure a positional deviation, the size of the sensor should be enlarged to widen the positional deviation measurement range. However, such enlargement of sensor size necessarily leads to an increase in the total light quantity of unwanted light impinging on the sensor and, thus, it leads to a decreased signal-to-noise ratio.

SUMMARY OF THE INVENTION

Japanese Laid-Open Patent Application, Laid-Open No. 167406/1990, filed in the name of the assignee of the subject application, proposes a position detecting system by which the effect of unwanted light is removed and signal processing of high signal-to-noise ratio is assured, such that the relative position of a first object such as a mask and a second object such as a wafer can be detected very precisely.

The present invention in some aspects thereof may be concerned with this type of position detecting system.

It is an object of the present invention to provide an improved position detecting system by which the effect of unwanted light impinging on a light receiving surface is reduced sufficiently to thereby assure enhanced precision of detection of the relative position of first and second objects.

DESCRIPTION OF THE PREFERRED EMBODIMENTS

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of a portion of an embodiment of the present invention as the same is applied to a semiconductor device manufacturing exposure apparatus.

FIG. 3 is a schematic view for explaining the principle of detecting the surface interval between first and second objects.

FIGS. 4A and 4B are schematic views, respectively, for explaining the principle of detecting the surface interval between first and second objects.

FIG. 5 is an enlarged view of a portion of FIG. 1.

FIGS. 10A and 10B are graphs for explaining the manner of signal processing.

FIGS. 12A and 12B are graphs for explaining the manner of signal processing.

FIG. 16 is a flow chart of semiconductor device manufacturing processes.

DESCRIPTION OF THE PREFERRED EMBODIMENTS

Figure 2A:
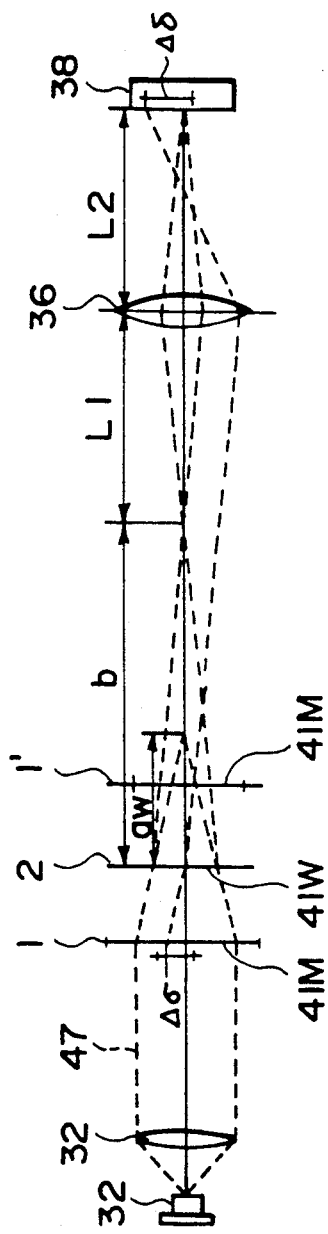
FIGS. 2A and 2B are schematic views, respectively, for explaining the principle of detecting the relative position of first and second objects.

In conjunction with a first embodiment of the present invention, a description will be made of the detection of relative position of first and second objects.

In this embodiment, waves (hereinafter "light") such as electoro-magnetic waves or acousto-optic waves emitted by a light source 31 are transformed by a collimator lens 32 into parallel light. The light is then directed by a light projecting lens 33 and a half mirror 34, and is projected obliquely upon a first physical optic element 41M provided on a first object 1 such as a mask M (see FIG. 5). The physical optic element 41M comprises a grating lens, for example, which is a kind of Fresnel zone plate.

The first physical optic element 41M has a light converging function, and it serves to project its diffraction light along a normal ($-Z$ direction) to the first object 1. The projected light impinges on a second physical optic element 41W provided on a second object 2 such as a wafer, spaced from the first physical optic element 41M by a predetermined distance. The second physical optic element 41M comprises a grating lens, for example.

The second physical optic element 41M has a light diverging function, and it serves to project the light toward an alignment head 24. The projected light is collected by a condensing lens 36 onto the detection surface of a detector 38. An output signal from the detector 38 is adjusted in the manner, to be described later, to detect any positional deviation between the first object (mask) 1 and the second object (wafer) along their surfaces. The mask 1 and the wafer 2 are held to maintain a gap in a predetermined range therebetween. The condensing lens 36 and the detector 38 are components of light detecting means.

In this embodiment, the wafer 2 is moved for its alignment. However, a mask chuck moving mechanism may be provided to move the mask 1. Only for convenience of explanation, hereinafter the first physical optic element 41M will be referred to as a "mask grating lens", the second physical optic element 41W will be referred to a "wafer grating lens", the first object will be referred to as a "mask", and the second object will be referred to as a "wafer".

In this embodiment, as described, the alignment pattern of the mask 1 is provided by a grating lens (a kind of Fresnel zone plate) having a predetermined focal length, and the light for the alignment as projected obliquely upon the mask 1 surface from the alignment head 24 is deflected in the direction ($-Z$ direction) of a normal to the mask 1 surface and is converged at a position (e.g. $Z = -187.0$ microns).

In this embodiment, the angle $\alpha$ of oblique projection of the light onto the mask 1 surface may preferably be within the following range:

$$10 < \alpha < 80.$$

The alignment pattern 41W of the wafer 2 is provided by an off-axis type grating lens having a pattern which is asymmetrical with respect to the Z axis. It is designed with a focal length of 217.0 microns, for example, and it serves to direct the convergent (divergent) light, transmissively diffracted by the grating lens of the mask 1, toward the alignment head.

Here, the alignment light is influenced by the lens function of the grating lens and impinges on the detector 38 within the alignment head 24. In the first embodiment, the alignment with respect to the direction of a scribe line (along which patterns are formed) is to be executed.

With this arrangement of the present embodiment, if the second object is deviated laterally by $\Delta\delta$ relative to the first object as illustrated in FIG. 2A, the angle of emission of the output light changes like a case wherein axial alignment of lenses of an optical system is destroyed. Thus, there occurs displacement of the gravity center of the spot of converged light on the surface of the detector 38. Assuming now that the angle of emission is small, the mask 1 and the wafer 2 are relatively deviated by $\Delta\sigma$ along their surfaces, the distance from the wafer 2 to the point of convergence of the light diffracted by the grating lens 41M of the mask 1 is a and the distance to the point of convergence of the light diffracted by the grating lens 41W of the wafer 2 is b, then the displacement $\Delta\delta$ of the gravity center of the spot of converged light upon the detector 38 surface is given by:

$$\Delta\delta = \Delta\sigma \times (b/a + 1) \qquad (1)$$

Namely, the gravity center displacement $\Delta\delta$ is being magnified by $(b/a+1)$.

If, for example, $aw = 0.5$ mm and $bw = 50$ mm, then according to equation (1) the gravity center displacement is being magnified by $101\times$.

Here, the gravity center displacement $\Delta\delta$ and the positional deviation $\Delta\sigma$ are in a proportional relationship with each other, as seen from equation (1). If a detector used has a resolution of 0.1 micron, then the resolution to the positional deviation $\Delta\sigma$ is 0.001 micron.

Details of the manner of detecting any positional deviation will now be explained. During the mask setting operation, the gravity center position as assumed when the mask and the wafer have no relative positional deviation is determined as a reference position. Then, during the actual position detecting operation, the magnitude of deviation in the X direction of the gravity center position from the thus determined reference position is detected. Finally, on the basis of the proportional relationship described above, the relative positional deviation between the mask and the wafer is determined.

In this embodiment, the second object is then moved on the basis of the positional deviation $\Delta\sigma$ obtained through signal processing by adjusting means (to be described), to thereby assure high precision positioning of the first object (mask) and the second object (wafer). After the positioning is completed, radiation energy is projected to the wafer, whereby a circuit pattern of the mask is transferred to the wafer.

Next, while taking what can be called a "mask lens $A^2$ method" as an example, details of the measurement of the spacing between the mask 1 and the wafer 2 and aligning them in a direction perpendicular thereto will be explained.

The mask lens $A^2$ method is such a method that uses gratings or grating lenses for light reception and projection prepared on a mask. Details are such as follows.

As shown in FIG. 3, light 47 incident on a first pattern $42_{in}$ on the first surface (mask) is diffracted at a first order, for example. It is directed toward the second surface (wafer) 2, at a predetermined angle with respect to a normal to the second surface 2. It is then regularly reflected by the second surface and, thereafter, it goes through a second pattern $42_{out}$ on the first surface 1. Here, in response to the spacing between the first and second surfaces 1 and 2, the position of just passing light on the second pattern $42_{out}$ changes (positional deviation $d_M$ with a spacing error dG).

While the second pattern $42_{out}$ serves to direct the output light 46 toward a light spot position detecting sensor 39 which is provided for the spacing measurement, it has such an optical function (focal length $f_M$) like a lens that the angle of deflection of output light changes with the position of incidence of the light on the second pattern $42_{out}$.

Namely, in principle, it is possible that the detector 39 receives the output light 46 in the manner as depicted in FIG. 4A. Here, the angle of deflection of the light may be uniform, as in FIG. 4B.

Namely, if a one-dimensional light spot position detecting sensor, for example, is placed at an appropriate position, any change in the position of light can be detected. Therefore, the system itself is usable. However, by using a light receiving lens 36 as shown in FIG. 3, the following advantageous effects are obtainable.

Namely, even if light is emitted slightly divergently in an opto-physical sense such that the light beam diameter is becoming large, the light receiving lens serves to collect the light and makes it possible to define on the sensor 39 a sharp light spot of high energy density. Also, if the sensor 39 is disposed at the focal point position of the light receiving lens 36 having a focal length $f_S$, then the system detects only the angle of light. As a result, if the light receiving lens and the sensor are made into an integral structure and if they are deviated in a direction perpendicular to the optical axis, such deviation does not adversely influence the detection. It it to be noted however that, even when the sensor cannot be disposed at the focal point position for some reason, the system itself is sufficiently practically provided that the effect of the deviation is so small that it can be neglected. Therefore, the position of the sensor should not be limited to the focal point position of the light receiving lens.

In FIG. 3, the displacement S of the spot on the sensor with a unit spacing is given by:

$$S = f_S/f_M \times d_M \quad (2)$$

When the angle of light emerging from the first pattern $42_{in}$ with respect to the normal to the second surface is denoted by $\theta_1$, the displacement S of the spot in response to a change in gap by a distance $d_G$ as compared with a reference gap, is given by:

$$S = 2 \cdot d_G \cdot (f_S/f_M) \cdot \tan\theta_1 \quad (2')$$

By using separate gap measuring means, the spacing between the mask and the wafer as they are held at a reference gap is measured beforehand. Also, the gravity center position of the light upon the sensor 39 corresponding to the reference gap, is determined beforehand as a reference position. During actual gap measurement, any deviation of the gravity center position from the reference position is detected, and the thus detected deviation is substituted into equation (2') to calculate the distance $d_G$. This is used as the deviation from the reference spacing, and the "current spacing" is determined.

In accordance with the principle describe above, the absolute magnitude of the spacing between a mask and a wafer can be measured. For example, when a wafer is supplied with a mask already being set and if the wafer is placed with a spacing of 100 microns which is larger than a desired spacing of 30 microns, the mask-to-wafer spacing of 100 microns can be detected very precisely and, on the basis of the measured value, the mask-to-wafer spacing can be adjusted to the desired spacing of 30 microns only by a single operation. Thus, quick gap setting is possible.

Figure 8:
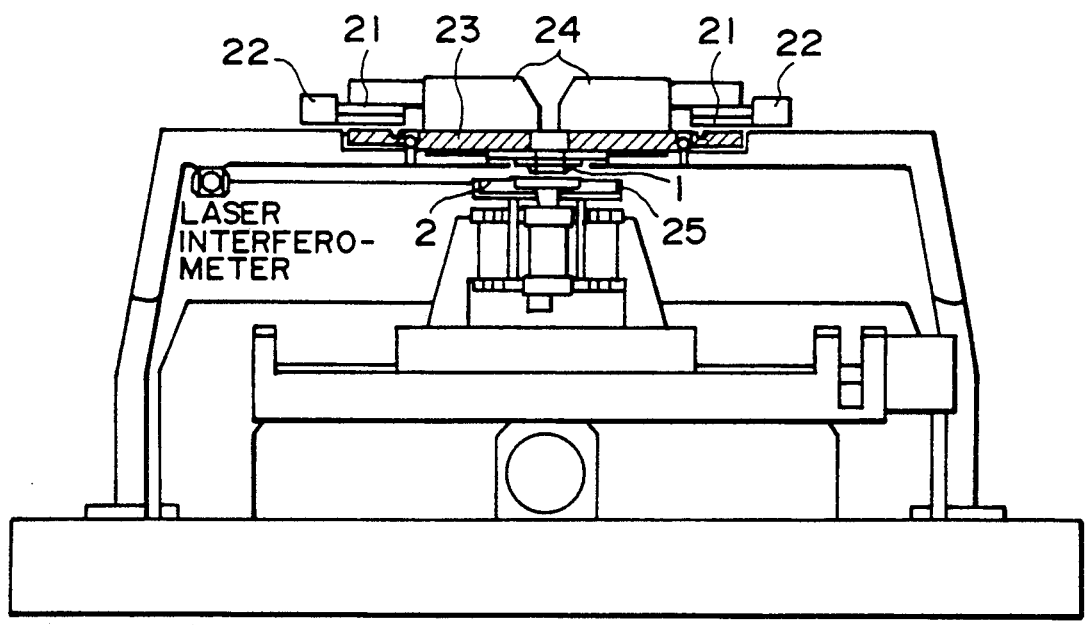
FIG. 8 is a side view of a portion of an embodiment wherein the invention is applied to a semiconductor device manufacturing exposure apparatus.
Figure 9:
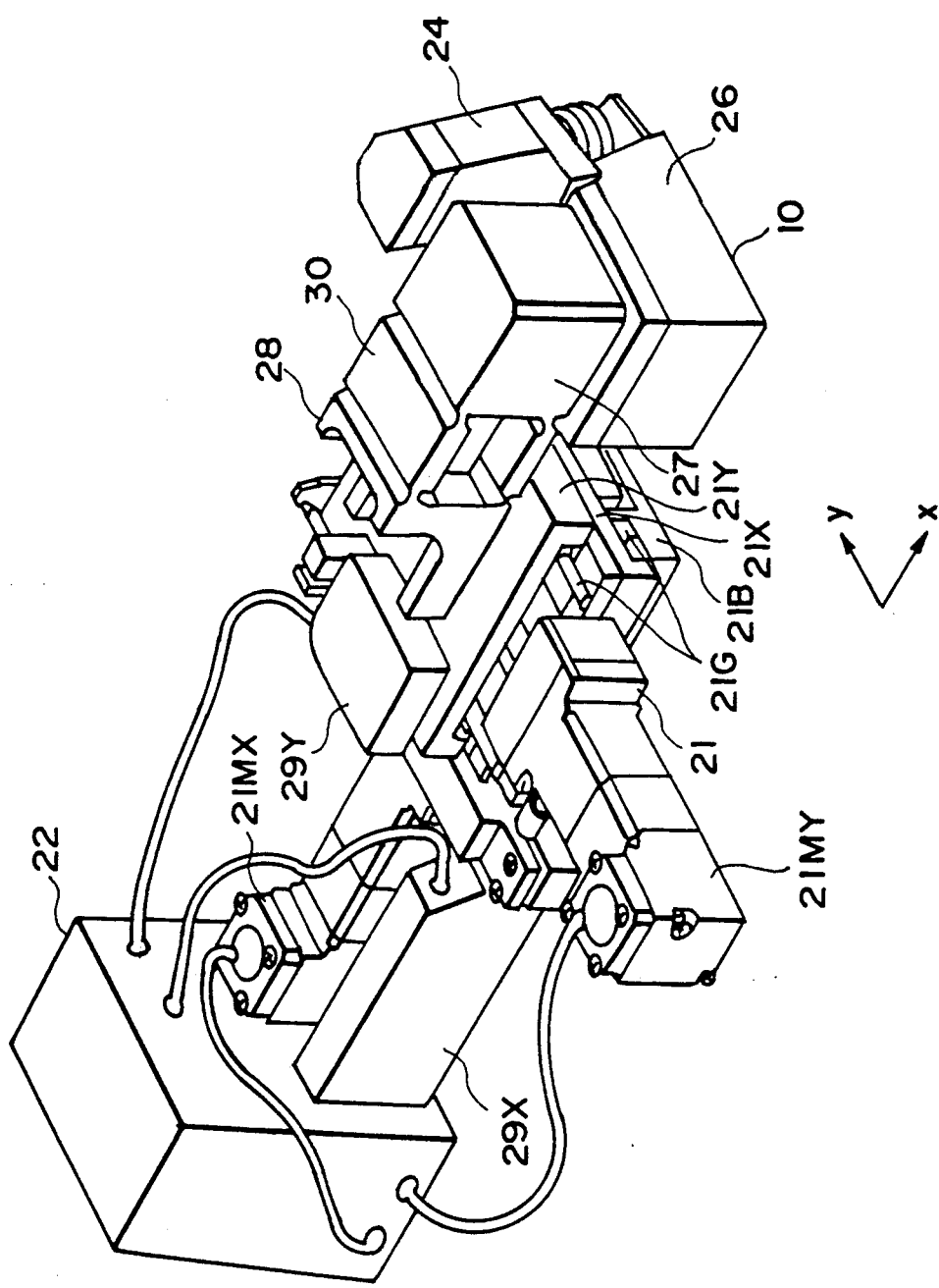
FIG. 9 is a perspective view of a portion of an embodiment wherein the invention is applied to a semiconductor device manufacturing exposure apparatus.

Components of this embodiment will be explained in detail in conjunction with FIGS. 1, 8 and 9.

Light beam emitted from the alignment pickup head 24 which is a casing for accommodating therein a light source and a sensor, for example, is projected on mark setting areas 20 on the mask 1 and the wafer 2. The reflected or diffracted light goes back to the alignment pickup head 24. The alignment pickup head 24 is mounted to a stage 21, and it is made movable two-dimensionally as desired in accordance with the location of the alignment region. The movement is controlled by a stage control means 22. Here, the stage 21 is guided by a super flat base plate 23, and any pitching or yawing is substantially prevented.

The stage control means 22 operates to drive the stage 21 at the time of the alignment operation or start of gap control, to move the head 24 to the position for illumination and detection of evaluation marks 20 of the mask and the wafer, which position is memorized beforehand. FIGS. 8 and 9 illustrate the moving mechanism including stage 21 and a portion around it.

The moving mechanism will be explained in detail. FIG. 9 shows details of the stage portion and the stage controller portion.

The alignment pickup head 24 is fixed to clamping means 27 for pressing with a constant pressure a super flat surface 10 of a support 26 against the super flat base plate 23, and it is placed on the upper portion of the alignment system structure with the intervention of the super flat base 23. The clamping means 27 is connected to a movable support 28 on a two-dimensionally movable stage 21, through leaf springs 30. The stage 21 comprises a base 21B, an X-axis slider 21X, a Y-axis slider 21Y, guides 21G for guiding the X-axis and Y-axis sliders, and drive sources 21MX and 21MY provided on the base 21B for moving the sliders 21X and 21Y in the X and Y directions, respectively.

The operations of the drive sources MX and MY are controlled by a controller 22 so as to move the head 24 in corresponding directions to place the same at a predetermined position. The amount of movement of the stage in corresponding directions is measured precisely by laser distance measuring devices 29X and 29Y. The obtained data is applied to the controller 22, on the basis of which the controller 22 in turn detects the current position of the head 24 and supplies signals to the drive sources MX and MY so as to place the head at the desired position. In this manner, the position of the head 24 is controlled precisely.

After the head is moved to the detecting position, the operation for detecting the lateral deviation and the spacing is carried out. On the basis of the result of detection, the wafer stage 25 is moved to correct the lateral deviation and the error in the spacing, for alignment control and spacing control. These operations are repeated, if necessary.

The alignment pickup head 24 houses therein a lateral deviation detecting system, a spacing detecting system, a light projecting system and a light receiving system. The light beam emitted from the light source (more specifically, a semiconductor laser) goes via a collimator lens 32, a light projecting lens 33 and a light projecting mirror 34, and it is projected on the evaluation mark setting region. The light beam emerging from the mark is directed by a detection lens 36 toward the detecting system, and impinges on a light receiving element 38 for lateral deviation detection and a light receiving element 39 for gap detection, both of which are provided on the same plane of a single base plate 37, whereby corresponding signals are produced. The alignment pickup head 24 has a light projecting and receiving window 35 which is covered by a filter for blocking the light from an exposure light source.

As for the evaluation mark, as shown in FIG. 5, a lateral deviation detecting mark 41M and spacing measuring marks $42_{in}$ and $42_{out}$ are provided on the mask, in juxtaposition to each other. Also, the wafer is provided with a mark 41W at a position corresponding to the position of the mark 41M.

In this embodiment, the system is so designed that the projected light 47 is parallel light as it is on the evaluation mark and that it is projected on the lateral deviation detecting mark 41M and the gap measuring mark $42_{in}$, in the light projection region, at the same time.

In the lateral deviation detecting system, the mark 41M on the mask 1 surface has a light converging function. Through the wafer mark 41W which has a function for imaging the point of convergence on a position optically conjugate with the detection surface, the lateral deviation is magnified on the detection surface and is detected. The light receiving lens 36 provides a relay lens system for relaying the point imaged by the wafer mark 41W to the lateral deviation detecting light receiving element 38. FIG. 2A illustrates this system in terms of lens power arrangement.

On the other hand, the spacing measuring system uses the mask lens $A^2$ method as described hereinbefore. The parallel input light goes through a spacing measuring input mark $42_{in}$ on the mask surface and it it diffracted and deflected thereby. Then, the light is regularly reflected by the wafer 2 surface (specular surface) and is projected upon a certain region on a spacing measuring output mark $42_{out}$ on mask surface, corresponding to the mask-to-wafer spacing. The light emits from the mask surface at an angle corresponding to the mask-to-wafer spacing, and is directed to the spacing measuring light receiving element 39 on which the light is displaceable in accordance with equation (2).

Figure 2B:
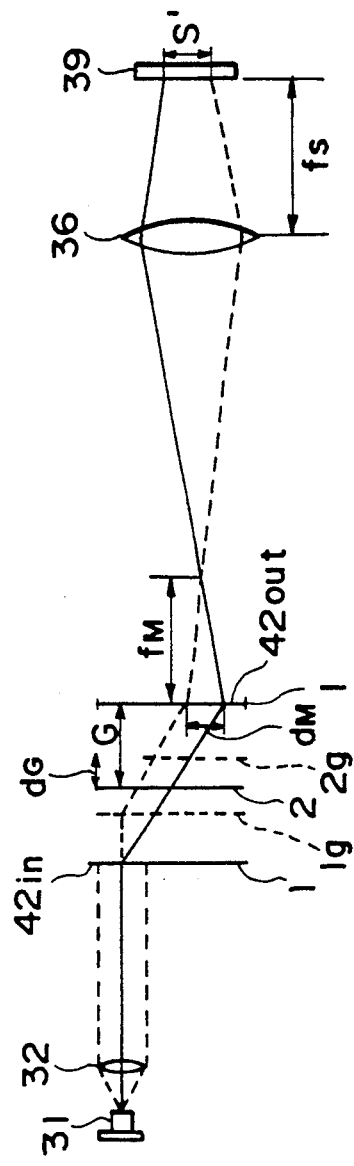

FIG. 2B illustrates the spacing measuring system in terms of lens power arrangement, like the case of the lateral deviation detecting system.

The detecting lens 36 of this embodiment is used in common and serves as the relay lens of FIG. 2A and also as the condensing lens of FIG. 2B.

Here, by making the effective distance $L_2$ from the detecting lens 36 of FIG. 2B to the sensor 38 surface equal to the effective distance $f_S$ to the sensor 39 surface of FIG. 2B, it becomes possible to provide the sensors 38 and 39 on one and the same base plate 37.

Figure 7:
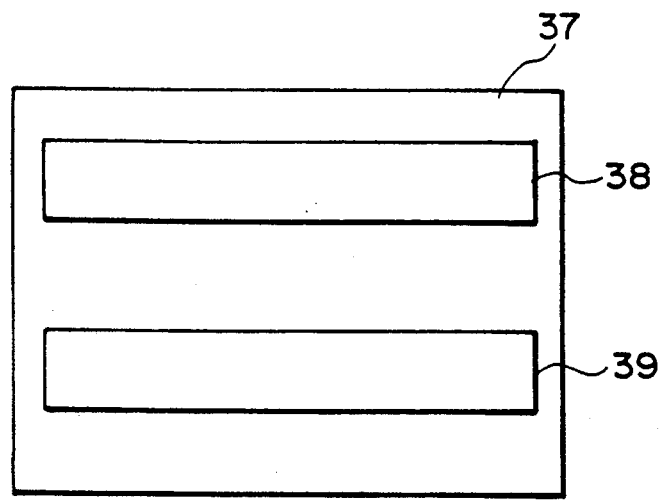
FIG. 7 is an enlarged view of a portion of FIG. 1.

As shown in FIG. 7, the sensors 38 and 39 are formed on the base plate 37, each in parallel to the X direction. On the other hand, if the distance from the wafer 2 surface to the detecting lens 36 is denoted by L, then the distance L may be set to satisfy:

$$L = bw + L_1$$

$$1/L_1 = 1/f_S + 1/L_2 = 2/f_S$$

therefore, $$L = bw + f_S/2 \quad (3)$$

In this embodiment, if the magnitude of L is determined beforehand, the magnitude of bw which is determined by the focal lengths of the grating lenses 41M and 41W may be set to satisfy equation (3). Also, the magnitude of aw may be set so that the positional deviation between the mask and the wafer is magnified correspondingly, in accordance with equation (1).

The sensor 38 for a signal light in the lateral deviation detecting system and the sensor 39 for a signal light in the spacing measuring system may be disposed on a single substrate defined along a spherical surface of a radius R, corresponding to the aberration of the detecting lens 36. While on that occasion the light projecting optical system and the light receiving optical system within the alignment pickup head may be of the same structure as those of the first embodiment, the provision of the sensors 38 and 39 in this manner makes it possible to remove or reduce an error in the measurement of the gravity position of the light upon the sensor, due to any deformation of a point image resulting from curvature of image or distortion of the detecting lens 36.

Figure 6A:
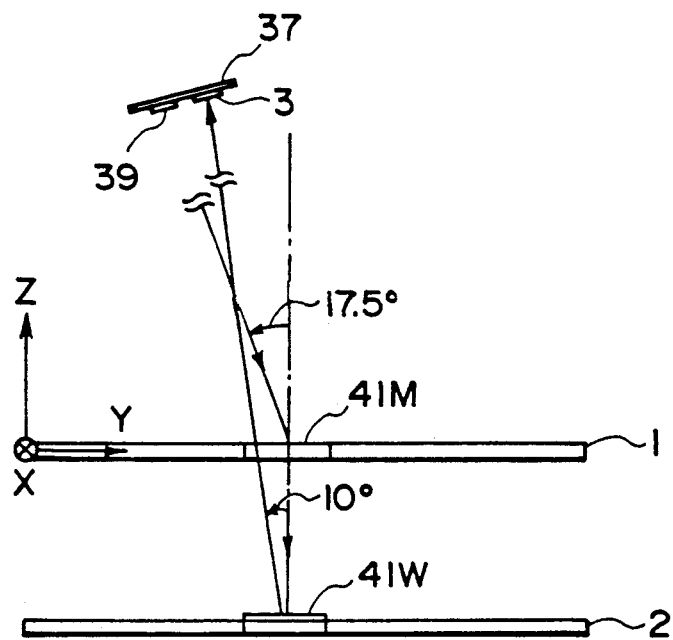
FIGS. 6A and 6B are enlarged views, respectively, of a portion of FIG. 1.
Figure 6B:
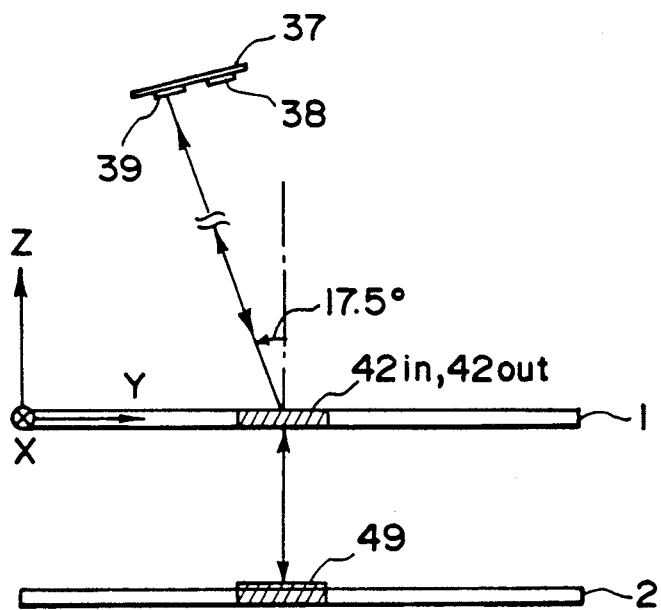

FIGS. 6A and 6B show the light paths as being projected on the Y-Z plane of FIG. 5. FIG. 6A shows the path of light for the lateral positional deviation measurement, and FIG. 6B shows the path of light for the spacing measurement. The light emitted from an unshown light source (semiconductor laser of a wavelength 830 nm) is obliquely projected upon the mask at an angle of 17.5 deg. The positional deviation measuring light goes substantially in parallel to the normal to the wafer 2 surface (or to the mask surface), while being influenced by the diffraction function of the physical optic element 41M of the mask 1.

On the other hand, the spacing measuring light goes while being deflected at a predetermined angle, to the X direction, with respect to the normal to the wafer 2 surface.

After being influenced by reflective diffraction and reflection by the physical optic element 41W of the wafer 2, these lights emerge from the wafer surface along separate paths and with different emission angles and they are projected on the sensors 38 and 39. The physical optic elements 41M and 41W are grating lens elements having predetermined focal lengths, respectively. Each element has a size of 50 × 180 (microns) and is formed on a scribe line (or a region corresponding to a scribe line) adjacent to a semiconductor circuit pattern region.

Next, the diffraction of the lateral positional deviation measuring light and the spacing measuring light by the physical optic elements 41M and 41W of the mask 1 and the wafer 2, will be explained.

The light incident on the mask 1 is transmissively diffracted by the grating lenses 41M and 42, such that lights of different diffraction orders such as zeroth order, ±first order, ±second order, for example, are produced. In this embodiment, transmissively diffracted light of positive first order, for example, is used. As regards the function of the grating lens, if the order is positive, it serves as a convex lens (light converging function); whereas if the order is negative, it serves as a concave lens (light diverging function).

The pattern of the grating lens 41M is so designed that the path of the positive first order transmission light is parallel to the normal to the mask surface. On the other hand, the grating lens $42_{in}$ serves as a deflecting element for deflecting the light to the X direction. In this embodiment, the lateral deviation measuring light is influenced by a negative first order reflective diffraction function (i.e. a concave lens function) of the grating lens 41W of the wafer 2.

On the other hand, the spacing measuring light is reflected at zeroth order by a blank region on the wafer 2, and, further, as the lateral deviation measuring light, such a light transmitted at zeroth order through the grating lens 41M of the mask 1 is used. Thus, the lateral deviation measuring light as emitted from the light source is diffracted by the mask grating lens 41M at positive first order (convex lens function) and, then, is diffracted by the wafer grating lens 41W at negative first order (concave lens function). Finally, as it passes again through the mask, it is influenced by a zeroth order diffraction function.

On the other hand, the spacing measuring light is reflected at zeroth order by the specular surface of the wafer and, subsequently, it is diffracted again by the mask grating lens 42, whereby negative first order diffraction light is produced.

Now, the method of decreasing degradation of the detection precision due to reception of unwanted light by the light receiving surface, by using an adjusting means, will now be explained.

The detector 38 comprise a one-dimensional sensor (CCD linear sensor) of a photoelectric conversion charge-coupled type, of a picture element size 13×13 (microns) and having picture elements of a number 2048. The charges accumulated through photoelectric conversion are transferred from each picture element to a CCD shift register and then to a charge detecting portion, and then are outputted from an output amplifier which comprises a source follower. Subsequently, the light intensities corresponding to the picture elements of the detector 38 are stored in the form of electric signals and, after analog-to-digital conversion, corresponding data is transferred to a microcomputer. The microcomputer processes the transferred data of "256 gradation", corresponding to the light intensities at the picture elements of the detector 38.

FIGS. 10A and 10B are graphs for explaining the signal obtainable from the detector 38, wherein the direction of array of the picture elements is taken on the axis of the abscissa.

If, for example, the portion of the signal from the detector 38 in the neighborhood of the light quantity peak shows a smooth curve in the direction of the picture element array, such as shown in FIG. 10A, then by defining the signal processing region symmetrically with respect to the peak position $B_2$, i.e., by selecting the range from point $B_1$ to point $B_3$, it is possible to disperse the effect of noises $N_1$ and $N_2$ symmetrically. In other words, it is possible to detect the light quantity gravity center position, while removing or reducing the effect of the noises $N_1$ and $N_2$.

If, however, there is a noise $N_3$ at the position $B_2'$ about the light quantity peak of the signal such as shown in FIG. 10B and when the light intensity $IN_3$ of the noise $N_3$ is greater than the light quantity peak $I_0$, the signal processing region would be defined symmetrically with respect to the point $B_2'$; namely the range from point $B_1'$ to point $B_3'$. As a result, noises $N_1$ and $N_2$ are picked up asymmetrically, and this leads to an error in the detection of the light quantity gravity center position.

Figure 11:
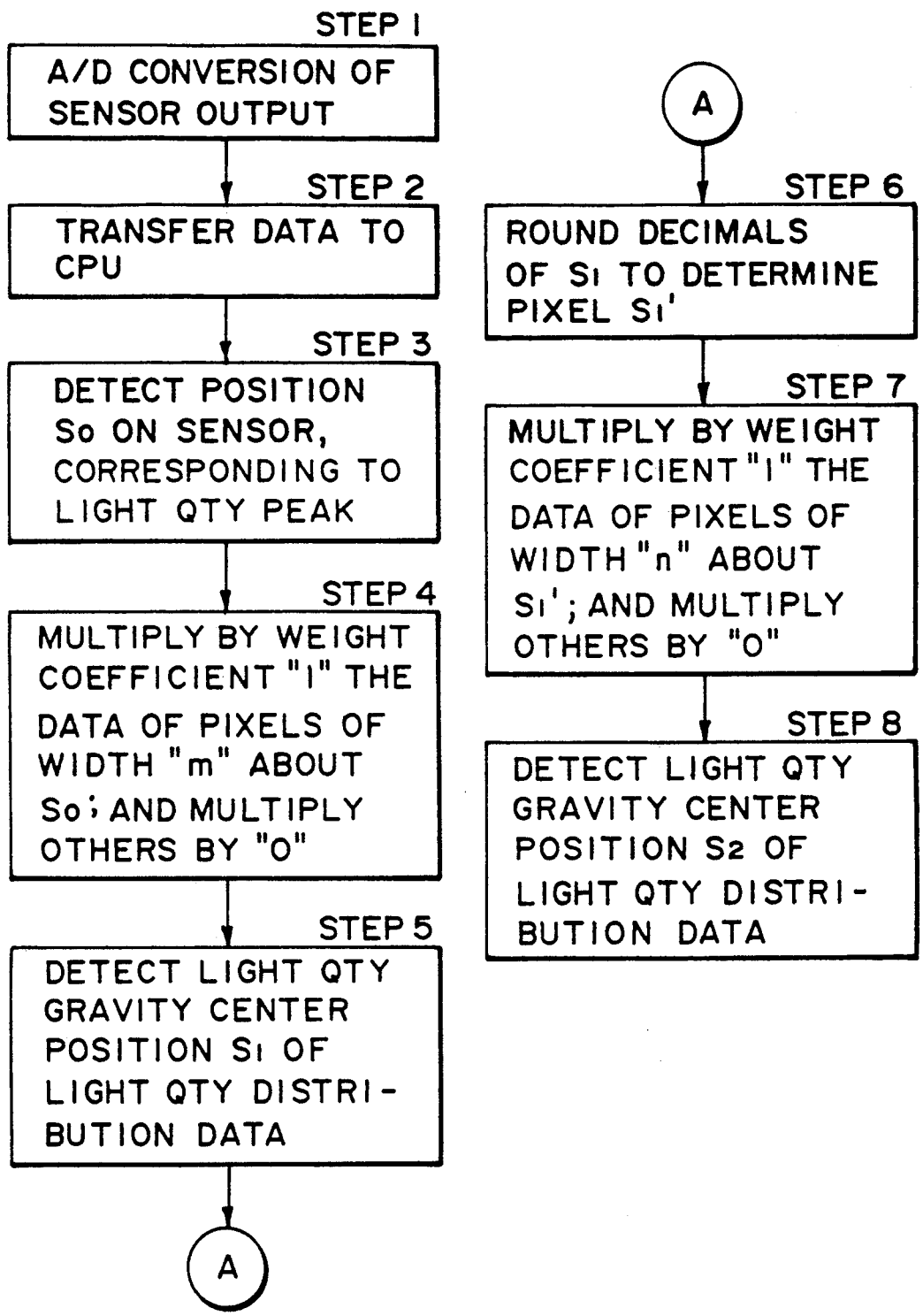
FIG. 11 is a flow chart of the signal processing.

In this embodiment, in consideration of this, the operation such as shown in the flow chart of FIG. 11 is executed to remove the effect of noise to assure high precision detection. More specifically, the light quantity gravity center position obtained as a result of weighting is taken as the center picture element of the signal processing region and, on the basis of this, the signal processing region is set again and, after this, the light quantity gravity center position is detected. This reduces the effect of noise as illustrated in FIG. 10B and assures high precision detection of the gravity center position.

Important features of this operation will now be explained in detail in conjunction with the flow chart of FIG. 11. In this flow chart, first the position $S_0$ of the picture element corresponding to the light intensity peak of the data supplied to the microcomputer is detected. Then, the data in the region of picture elements of a width n about the position $S_0$ is multiplied by a weight coefficient "1" while the remaining data is multiplied by a weight coefficient "0". After the operation in step 2 is carried out, the gravity center position of the light is detected on the basis of the obtained data, and the position $S_0$ of the picture element corresponding to it is detected. The algorithm therefor may be that: the data of the positive m-th picture element about the reference picture element of the sensor is multiplied by a weight of "1", together with its sign and, after detecting the moments of all picture elements and summing them, the resultant is divided by the sum of all the picture element data corresponding to the total light quantity within the region. The real numerical value, as obtainable by multiplying the result of division by the picture element size in the positional deviation detecting direction, is the light gravity center position $S_1$ to be detected.

At step 6, the light quantity gravity center position $S_1$ detected in step 5 is rounded to determine the picture element $S'_1$. At step 7, the data of the picture elements of a width n about the position $S'_1$ is multiplied by a weight coefficient "1", while the remaining data is multiplied by a weight coefficient "0". The signal processing region defined in this manner is illustrated in FIG. 12A, as the FIG. 10 example. It is seen that, as compared with the signal processing region of FIG. 10B, the set region is closer to the signal processing region (of FIG. 12B) which is desirable.

Figure 13:
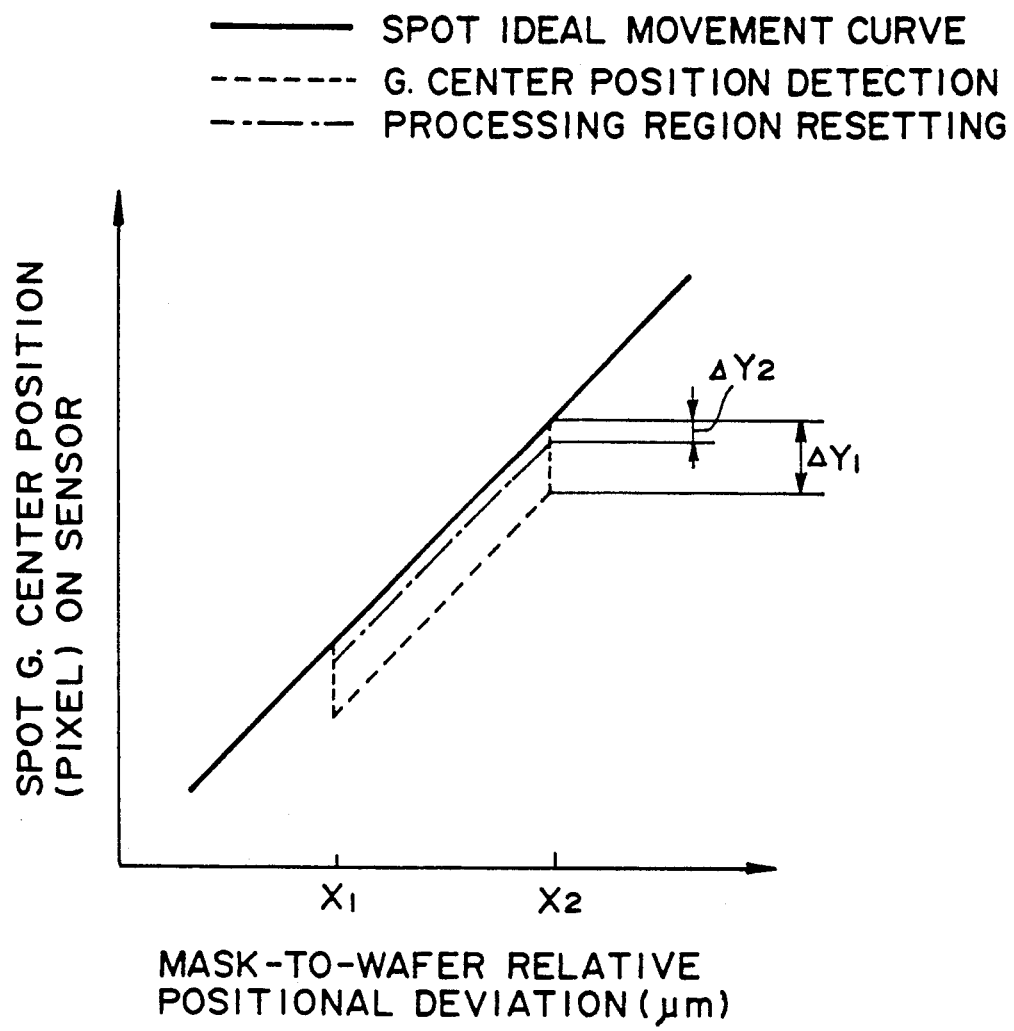
FIG. 13 is a graph for explaining the detection precision of signal processing.

FIG. 13 is a graph schematically illustrating the improvement in the detecting precision attainable by the operations described above. In the positional deviation detecting system of this embodiment, the light quantity gravity center position on the sensor displaces linearly as depicted by a solid line, with the relative positional deviation between a mask and a wafer. However, if the signal processing system is only arranged so that the signal processing region is simply set about the light quantity peak, an error $\Delta Y_1$ would be included such as depicted by a broken line. In this embodiment, in consideration of this, the signal processing region is set again, and this effectively reduces the error to $\Delta Y_2$.

Since in general the quantity of signal light is much greater than the noise, the signal processing region set again can be very close to the one shown in FIG. 12B and, therefore, the remaining detection error $\Delta Y_2$ is so small that it can be neglected without any inconvenience.

Figure 14:
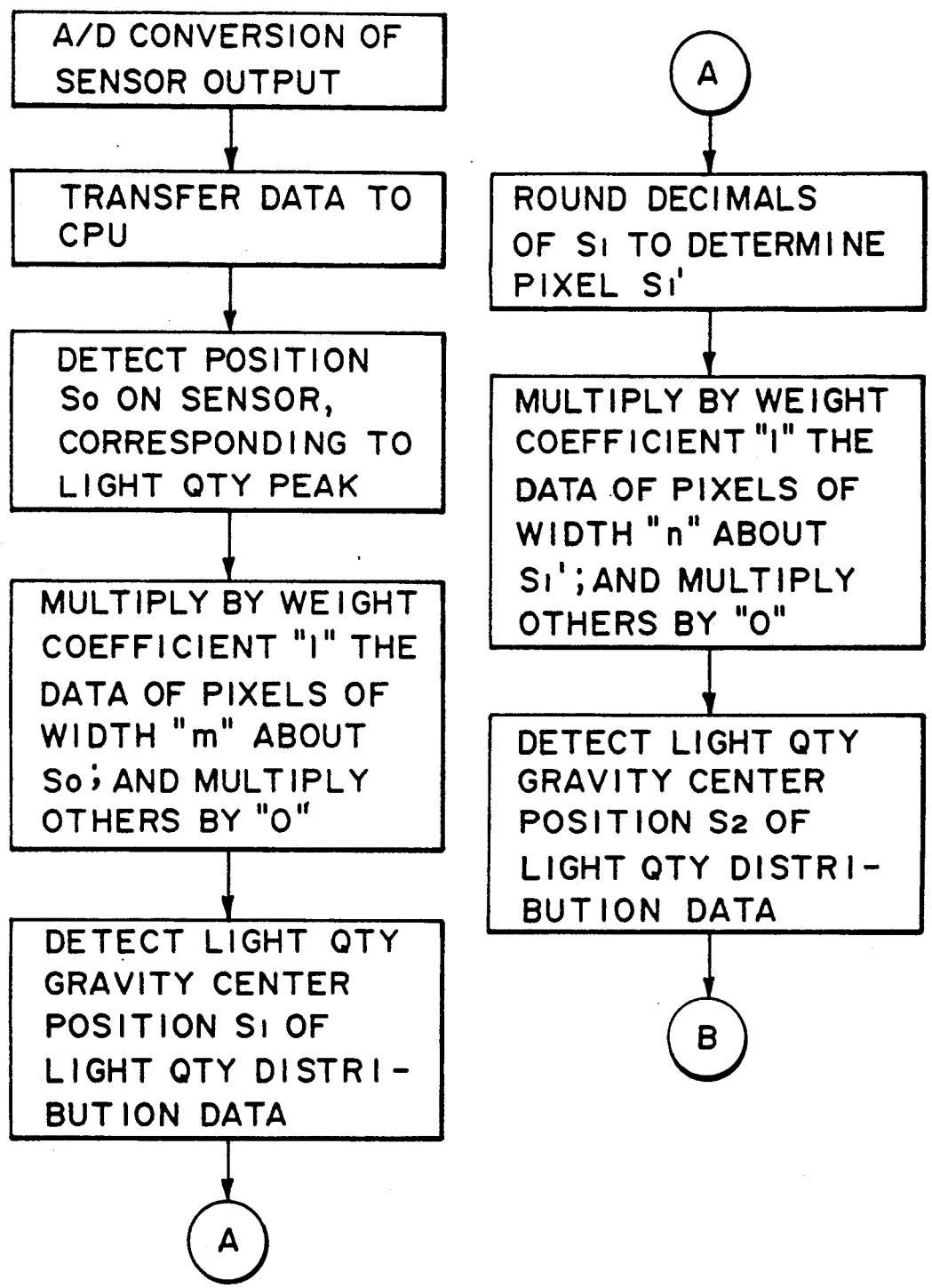
FIG. 14 is a flow chart of signal processing in accordance with another embodiment of the present invention.
Figure 15:
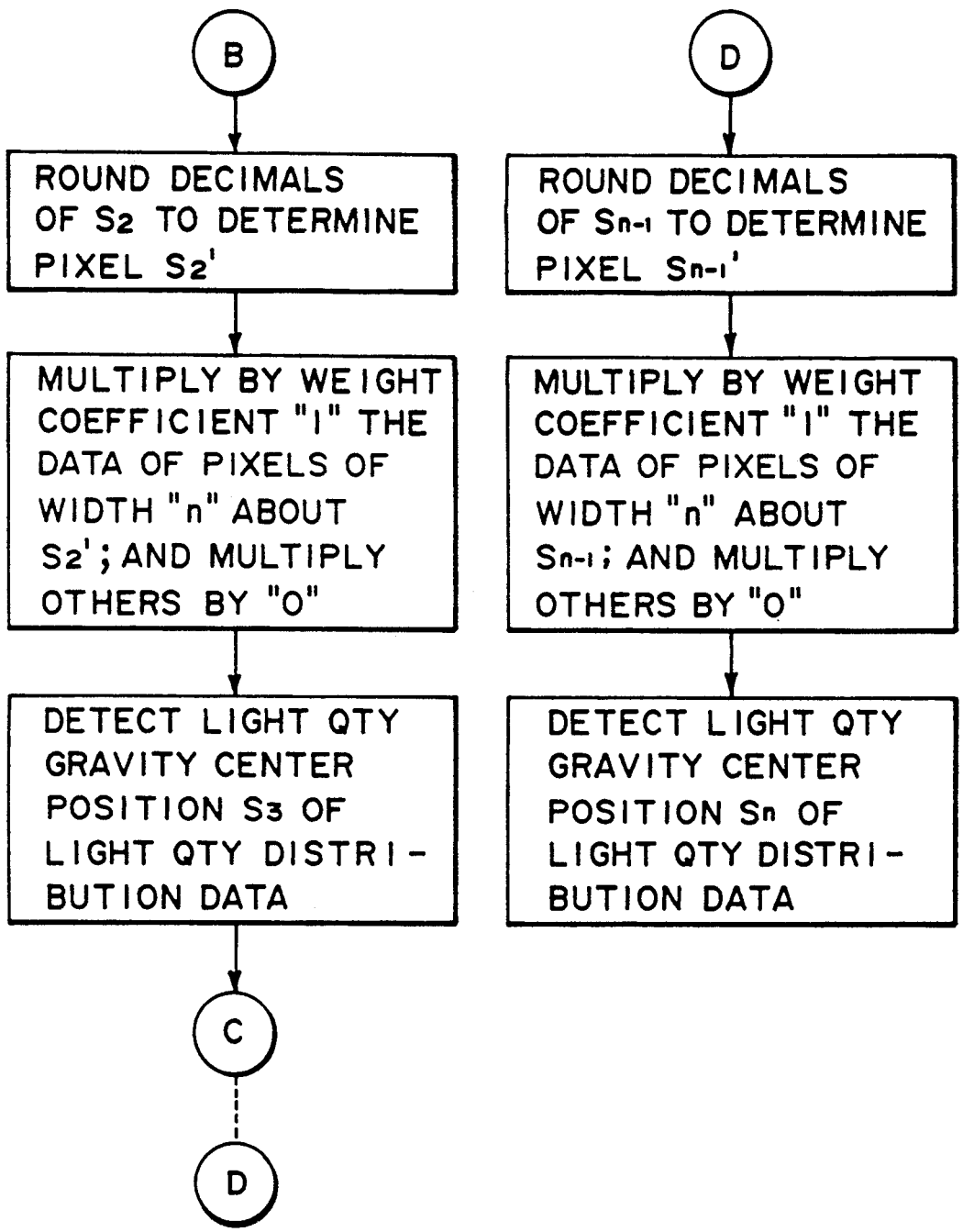
FIG. 15 is a flow chart of signal processing in accordance with a further embodiment of the present invention.

FIGS. 14 and 15 are flow charts for explaining further embodiments of the signal processing method according to the present invention. When the light beam impinging on one picture element of the detector (sensor) is sufficiently large or, alternatively, the signal-to-noise ratio is very low so that the optimum light quantity gravity center position cannot be determined by a single detecting operation, the operation for detecting the center picture element may be repeated through appropriate times in accordance with the flow chart of FIG. 14 or 15.

When the picture elements are rough relative to the diameter of the light beam or if the signal-to-noise ratio is not very low, n=2 may be sufficient. While in the embodiments described above the method of detecting the light quantity gravity center position has been explained as an example of detecting the center picture element of the light, the outputs of the picture elements may be first raised to the n-th power and then the moments of the resultant may be detected (n-th power gravity center).

Further, the weight coefficients are not limited to "1" and "0". If it is predicted that the light quantity distribution can be defined by an ordinary function such as a Gaussian distribution function, for example, the function of the weighting may be $f(x)=\sin^{2x}$ (x corresponds to a picture element).

As described hereinbefore, while taking the light quantity gravity center position of the light incident on the detection surface (sensor surface), once detected, as the center for the signal processing, the signal processing region is set again and then the light quantity gravity center position is determined. This assures high precision detection of the gravity center position even if the signal from the detector contains a noise or ripple. As a consequence, the relative position of first and second objects can be detected very precisely.

FIG. 16 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 17:
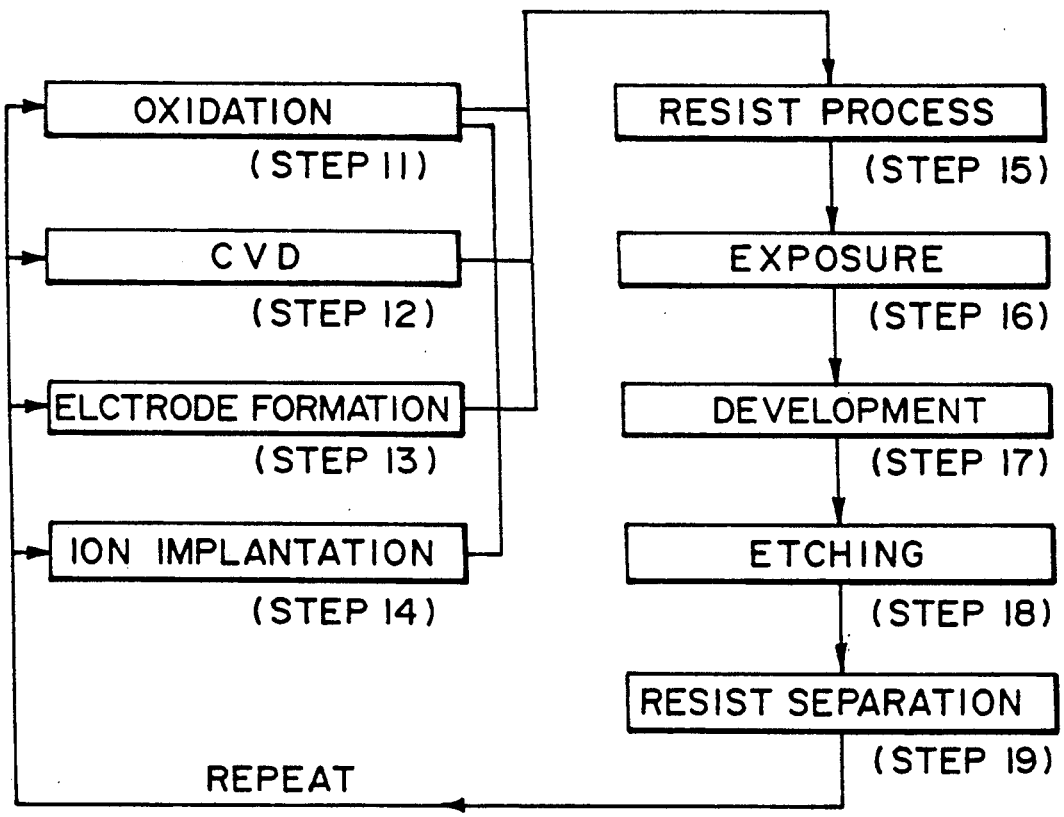
FIG. 17 is a flow chart of a wafer process.

FIG. 17 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting the relative position of two objects, comprising the steps of:

projecting light to the two objects so that the light from the two objects is received by a position detector, applying to an output signal from the detector a weight coefficient corresponding to the position to determine a gravity center of the light incident;

setting a region of the position detector on the basis of said determination;

determining again the gravity center of the light incident, on the basis of the set region; and determining the relative position of the two objects on the basis of said second determination.

2. A method according to claim 1, further comprising adjusting the relative position of the two objects on the basis of said determination of the relative position.

3. A method according to claim 1, wherein said region setting and said second determination of the gravity center are repeatedly executed.

4. A method according to claim 1, wherein the relative position of the two objects resides in the direction perpendicular to a direction along which the two objects are opposed to each other.

5. A method according to claim 1, wherein the relative position of the two objects resides in the direction along which the two objects are opposed to each other.

6. A method according to claim 1, wherein the two objects comprise a mask and a wafer.

* * * * *